(12) United States Patent
Mark

(10) Patent No.: US 7,453,261 B1
(45) Date of Patent: Nov. 18, 2008

(54) METHOD OF AND SYSTEM FOR MONITORING THE FUNCTIONALITY OF A WAFER PROBE SITE

(75) Inventor: David Mark, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 40 days.

(21) Appl. No.: 11/588,771

(22) Filed: Oct. 27, 2006

(51) Int. Cl.
*G01R 31/28* (2006.01)

(52) U.S. Cl. .................. 324/158.1; 324/758

(58) Field of Classification Search ......... 324/754–758, 324/765, 158.1; 209/573
See application file for complete search history.

(56) References Cited

U.S. PATENT DOCUMENTS

| | | | |
|---|---|---|---|
| 6,281,694 B1 * | 8/2001 | Tsai | 324/758 |
| 6,717,430 B2 * | 4/2004 | Burch | 324/765 |
| 6,764,866 B1 * | 7/2004 | Lin et al. | 438/11 |
| 7,112,979 B2 * | 9/2006 | Arabi et al. | 324/765 |
| 7,230,439 B2 * | 6/2007 | Tan | 324/758 |
| 7,388,393 B2 * | 6/2008 | Yamamoto | 324/765 |
| 2002/0049554 A1 * | 4/2002 | Miller | 702/104 |
| 2005/0212538 A1 * | 9/2005 | Oborny | 324/754 |

* cited by examiner

*Primary Examiner*—Ha Nguyen
*Assistant Examiner*—Arleen M Vazquez
(74) *Attorney, Agent, or Firm*—John J. King

(57) ABSTRACT

A method of monitoring the functionality of a wafer probe is disclosed. The method comprises applying a multi-site probe to a plurality of semiconductor dies; comparing the failure rate of a first probe site of the multi-site probe with the failure rate of a second probe site of the multi-site probe for a test of the plurality of semiconductor dies; and determining that a probe site of the multi-site probe is defective based upon comparing the failure rate of the first probe site of the multi-site probe with the failure rate of the second probe site of the multi-site probe. A system for monitoring the functionality of a wafer probe site is disclosed.

20 Claims, 6 Drawing Sheets

| Soft Bin Code | Site Number 0 | Site Number 1 | Total |
|---|---|---|---|
| 0 | 1 | | 1 |
| 5 | 2 | | 2 |
| 6 | 2 | 3 | 5 |
| 8 | 76 | 65 | 141 |
| 9 | 251 | 232 | 483 |
| 15 | 1 | 4 | 5 |
| 18 | 7 | 9 | 16 |
| 20 | 113 | 111 | 224 |
| 22 | 3 | 6 | 9 |
| 24 | 64 | 67 | 131 |
| 30 | 882 | 857 | 1738 |
| 31 | 10 | 8 | 18 |
| 32 | 275 | 287 | 562 |
| 33 | 5 | 1 | 6 |
| 34 | 46 | 50 | 96 |
| 35 | 2 | 2 | 4 |
| 36 | 54 | 47 | 101 |
| 39 | 9 | 15 | 24 |
| 40 | 5 | 2 | 7 |
| 42 | 19 | 8 | 27 |
| 43 | 10 | 17 | 27 |
| 44 | 167 | 153 | 320 |
| 46 | 2 | | 2 |
| 47 | 6 | 7 | 13 |
| 48 | 13 | 6 | 19 |
| 50 | | 1 | 1 |
| 62 | 1 | | 1 |
| 63 | | 61 | 61 |
| 72 | 2 | 4 | 6 |
| 73 | 1 | | 1 |
| 114 | | 1 | 1 |
| 126 | 4 | 2 | 6 |
| 130 | 3 | 2 | 5 |
| 134 | 3 | 1 | 4 |
| 136 | | 2 | 2 |
| 140 | | 1 | 1 |
| 142 | | 8 | 8 |
| 143 | 1 | | 1 |
| 144 | 1 | | 1 |
| Total | 2040 | 2040 | 4080 |

FIG. 6

METHOD OF AND SYSTEM FOR MONITORING THE FUNCTIONALITY OF A WAFER PROBE SITE

FIELD OF THE INVENTION

The present invention relates generally to integrated circuit testing, and in particular, to a method of and system for monitoring the functionality of a wafer probe site.

BACKGROUND OF THE INVENTION

In the production of integrated circuits, the yield of dies from wafers may have a significant impact on the performance of a manufacturer. Accordingly, any steps taken during the manufacturing of integrated circuits which improve wafer yield or reduce the time and resources for determining functioning dies is important. Wafer testing is performed before a wafer is sent to die assembly during semiconductor device fabrication. Individual integrated circuits on the wafer are tested for functional defects by applying special test patterns to them. The wafer testing is performed using a piece of test equipment called a wafer probe tester in a process referred to as a probe test or wafer sorting process. Nearly all integrated circuit wafers are probed for some basic performance verification. Because variations in materials and the fabrication process result in a range of performance, all dies are not identical, even on the same wafer. While dies on wafers generally receive at least a set of key DC measurements, a full set of tests over the full range of operating frequencies and input/output conditions may be specified, verifying the performance of each die that will be packaged or become part of an integrated subsystem. Various measurements allow the better dies to be separated from the normal or below normal performing dies. An accurate and repeatable test system can sort the individual die into performance categories in a process generally referred to as binning. That is, a die is assigned a bin number based upon the results of a series of tests, where the bin number provides an indication of the performance of the die. For example, a die that passes a greater number of tests would be placed in a different bin indicative of different operating characteristics, such as operating frequency. Individual die that fail testing are marked with an ink dot, or indicated on a wafer map, so they are scrapped when the wafer is diced to avoid the cost of packaging known bad dies. A lot of wafers is generally tested together, before being shipped to another location where dies which have not failed are packaged as integrated circuit packages.

Two primary issues in the testing of wafers are the performance of the wafer sorter probe card itself, and calibration of the test system. Because integrated circuit testing is a sensitive mechanical process, issues related to the performance of the wafer sort probe card include the reliable contact of the probe site to the wafer test points, and the accurate positioning of the probes. Wafer sort probe cards are prone to mis-binning due to usage or physical damage. Information related to sort bin and probe card site number information is saved in a text file to be processed at a later time. The sorted wafer is then taken off the wafer sorter and may be shipped to the assembly site as a part of a lot which has been tested. According to conventional methods, the bin and site information is summarized at some later time. Bin totals by probe site number and the difference in bin statistics between probe card site numbers are calculated. The summaries of the site and composite wafer maps do not occur while the wafers of a lot are on the wafer sorter, and may even occur after the wafer has been shipped to assembly. Accordingly, the verification of the mis-binning requires that the wafer be setup for wafer sort again and retested. This verification according to conventional methods wastes tester time and other resources such as the additional time to relocate and return the lot of wafers to the wafer sorter and the time required by the test operator.

Accordingly, there is a need for an improved method of and system for monitoring the functionality of a wafer probe site.

SUMMARY OF THE INVENTION

A method of monitoring the functionality of a wafer probe site is disclosed. The method comprises applying a multi-site probe to a plurality of semiconductor dies; comparing the failure rate of a first probe site of the multi-site probe with the failure rate of a second probe site of the multi-site probe for a test of the plurality of semiconductor dies; and determining that a probe site of the multi-site probe is defective based upon comparing the failure rate of the first probe site of the multi-site probe with the failure rate of the second probe site of the multi-site probe. Determining that a probe site of the multi-site probe is defective may comprise determining that a probe site of the first probe site and the second probe site has a disproportionate number of errors. The method may also comprise applying a multi-site wafer probe to a plurality of semiconductor wafers, and retesting semiconductor dies of the plurality of dies if a probe site is determined to be defective.

According to an alternate embodiment, a method of monitoring the functionality of a wafer probe site comprises applying a multi-site probe to a plurality of semiconductor wafers comprising semiconductor dies; comparing the failure rate of a first probe site of the multi-site probe with the failure rate of a second probe site of the multi-site probe for a plurality of semiconductor dies of the plurality of wafers; determining that a probe site of the multi-site probe is defective based upon comparing the failure rate of the first probe site of the multi-site probe with the failure rate of the second probe site of the multi-site probe; and retesting semiconductor dies of the plurality of semiconductor wafers. Retesting semiconductor dies of the plurality of semiconductor wafers may comprise retesting selected semiconductor dies of a wafer with a different probe, or retesting an entire wafer with a different probe. The method may further comprise a step of identifying defective dies of the plurality of semiconductor dies after retesting semiconductor dies.

A system for monitoring the functionality of a wafer probe site is also disclosed. The system comprises a multi-site probe having a plurality of probe sites; a wafer sorter coupling a wafer to the multi-site probe; a test computer coupled to apply test vectors to the multi-site probe and receive output signals from the multi-site probe; and an output of the test computer comprising a comparison of the failure rate of a first probe site of the multi-site probe with the failure rate of a second probe site of the multi-site probe for a test of the plurality of semiconductor dies. The output of the system may comprise a comparison of the failure rate of the first probe site of the multi-site probe with the failure rate of the second probe site of the multi-site probe for each test of a plurality of tests of a plurality of wafers having semiconductor dies. The system of may further generate a supplemental output after retesting semiconductor dies of the plurality of semiconductor dies, wherein the supplemental output comprises a determination of defective semiconductor dies.

BRIEF DESCRIPTION OF THE DRAWINGS

FIG. 6 is a bin code table showing an example of defective wafers associated with bin tests according to an embodiment of the present invention;

DETAILED DESCRIPTION OF THE DRAWINGS

Figure 1:
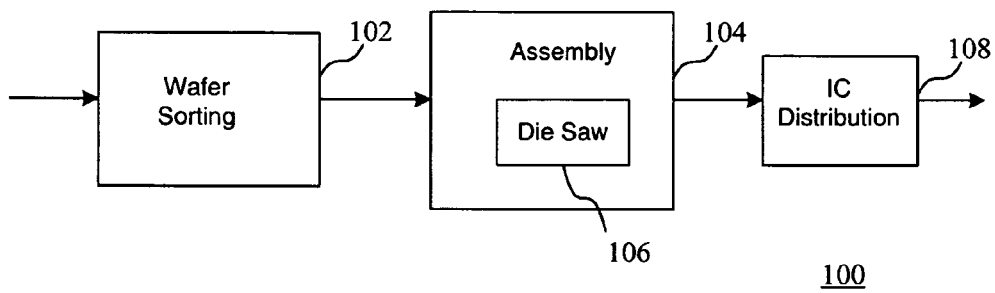
FIG. 1 is a block diagram of a system for producing integrated circuits according to an embodiment the present invention.

Turning first to FIG. 1, a block diagram of a system 100 for producing integrated circuits according to an embodiment of the present invention is shown. In particular, a wafer sorting process 102, which will be described in more detail in reference to FIGS. 2-9, is used to test dies of semiconductor wafers. During the wafer sorting process, dies are tested to determine both whether the dies are defective and the performance characteristics of the dies. Examples of wafer sorters are generally available from Credence Systems Corporation of Milpitas, Calif. or Teradyne, Inc. of Boston, Mass., and are well known in the art of semiconductor manufacturing. After wafer sorting, the wafers are removed from the wafer sorter and moved to an assembly process 104. The assembly process 104 includes a die sawing process 106. The packaging of dies which are not determined to be defective is also performed during the assembly process. Assembled ICs are shipped during a distribution process 108.

As will be described in more detail below, the wafer sorting process analyzes the performance of a multi-site probe to determine, in real time, whether a probe site of the multi-site probe is defective. That is, during the testing of at least one wafer, or a lot of wafers, the system and methods enable the determination of whether one or more probe sites of a multi-site probe are not functioning correctly. The systems and methods described below provide significant improvement by enabling an operator of the wafer sort equipment to detect a problem with a probe site while the wafers are still in a wafer sorting process, and before they are provided to an assembly process. That is, by analyzing data associated with the multi-site probe during the wafer sorting process while the wafers are still in the wafer sorter or before the wafers have been provided to another step of the assembly process, the yield of functioning integrated circuits will significantly increase, while the cost of production of integrated circuits will decrease.

Figure 2:
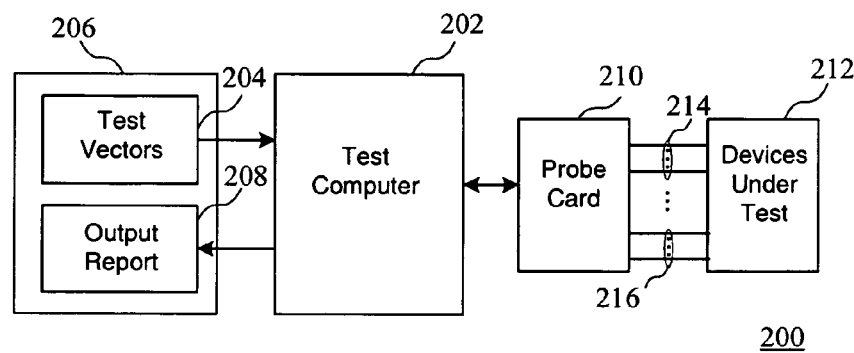
FIG. 2 is a block diagram of a system for testing semiconductor wafers according to an embodiment of the present invention.

Turning now to FIG. 2, a block diagram of a system 200 for testing semiconductor wafers according to an embodiment of the present invention is shown. In particular, a test computer 202 is coupled to receive a plurality of test vectors 204 of a test program 206 and generate an output report 208 which is based upon outputs of a probe card 210. While reference is made to a probe card, the probe card 210 may comprise any device or fixture having a plurality of probes. As will be described in more detail below, the probe card 210 is coupled to devices under test 212 by a plurality of probe sites including probe sites 214 and 216 shown in FIG. 2. Although two probe sites are shown, a probe card may include many probe sites, where each probe site includes a number of probes. As will be described in more detail below in reference to the methods of FIGS. 7-9, the test computer will analyze the outputs of the probe card to determine whether a probe site of the probe card may be defective. This will prevent the wafer from being removed from the wafer tester and save time and resources. That is, because the lot of wafers may be physically moved to another location after the lot has been tested, it requires additional time and resources to relocate the lot for further testing after analysis of the data. In the event that the wafers of the lot have already been sawed during the assembly process, it is very difficult to retest a die if a probe is later determined to be defective. Some criteria, such as setting a minimum bin count, may be set before flagging the operator to prevent alerting the operator with an inaccurate flag. That is, the data may not be reliable if only a small number of wafers have been tested.

Figure 3:
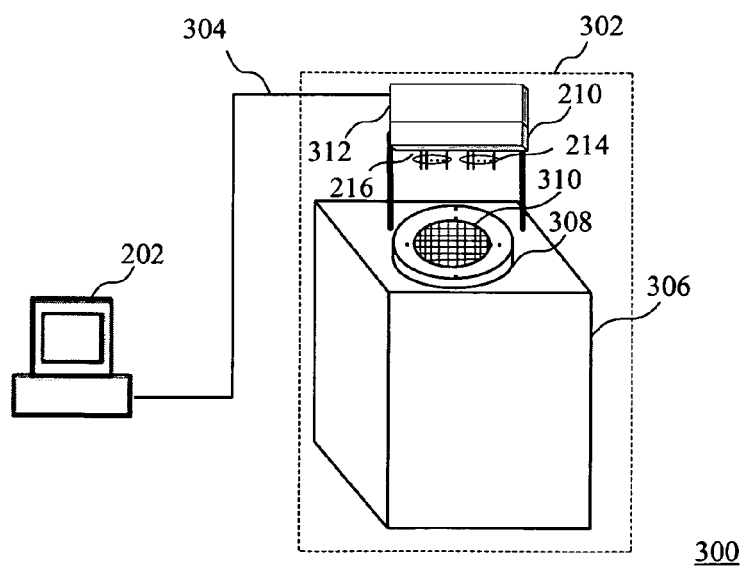
FIG. 3 is a block diagram of a test system according to an embodiment of the present invention.
Figure 4:
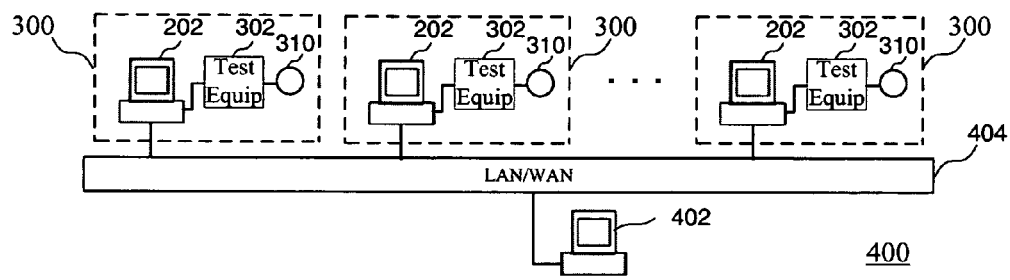
FIG. 4 is a block diagram of a semiconductor test network having a plurality of test systems according to an embodiment of the present invention.

Turning now to FIG. 3, a block diagram of a test system 300 according to an embodiment of the present invention is shown. In particular, the test computer 202 is coupled to a wafer tester 302 by way of a communication link 304. The communication link could be any type of communication channel, such as a direct connection, or a connection by way of a local area network (LAN) or a wide area network (WAN). The test system 302 comprises a wafer sorter 306 having a base 308 receiving the devices under test comprising a wafer 310. The wafer sorter stores a lot of wafers and enables testing of each wafer of the lot during the wafer sorting process before the lot is removed from the wafer sorter and transferred to another location. A probe unit 312 comprises the probe card 210 having the probe sites 214 and 216. As shown in the embodiment of FIG. 4, a semiconductor test network 400 comprises a plurality of test systems. In particular, the semiconductor test system 400 comprises a plurality of test systems 300 as described in FIG. 3, or other suitable test systems. According to one embodiment of the invention, data associated with a plurality of test equipment may be analyzed by way of a single computer 402 by way of a network, such as a local area network or a wide area network. That is, a single operator may monitor the functionality of multi-site probes of multiple test systems at a single computer, improving the efficiency of the wafer sorting process.

Figure 5:
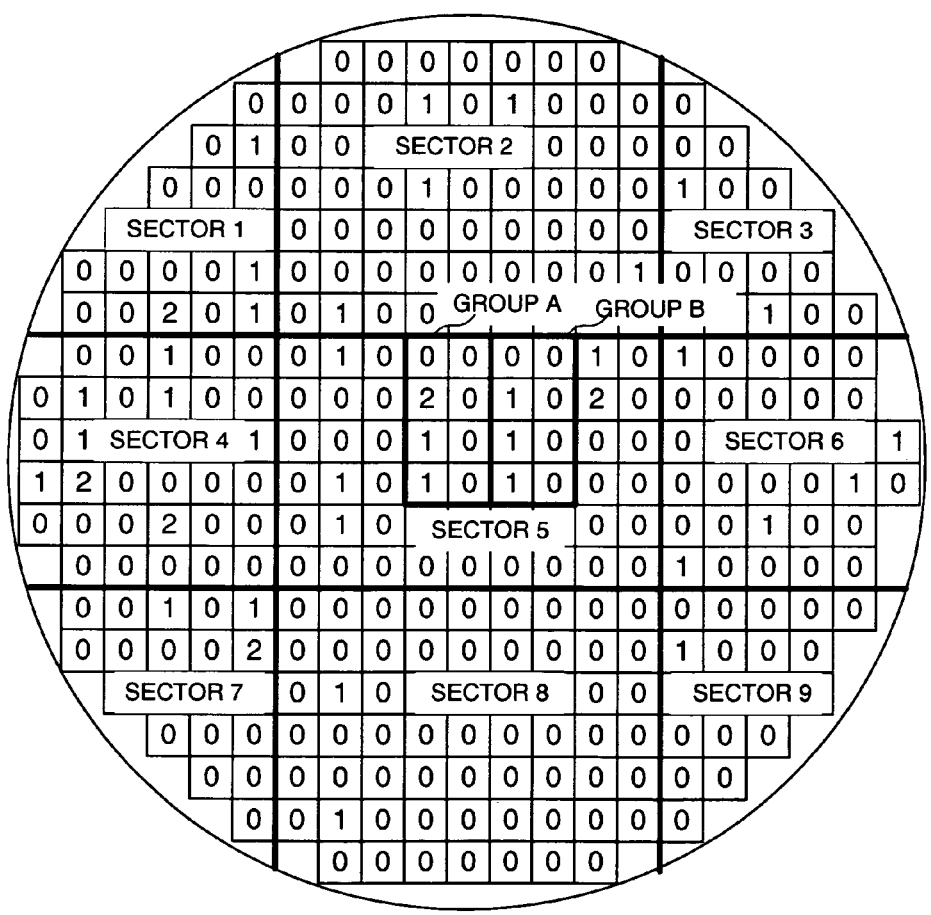
FIG. 5 is a top plan view of a composite wafer map according to an embodiment of the present invention.

Turning now to FIG. 5, a composite wafer map according to an embodiment of the present invention is shown. One way of identifying mis-binning is to compare the bin yield of different sites and if there is a large difference, stop wafer sort by embedding the comparison at wafer sort. The composite wafer map of FIG. 5 provides information related to defective dies based upon outputs of a probe card having two probe sites, and preferably relates to a single bin number for a given lot of wafers. A separate composite wafer map for a lot or a portion of a lot may be created for each bin number. The composite wafer map indicates the number of failed dies for a given bin number based upon the die location for a lot of wafers, where the lot of wafers may comprise approximately 10-25 wafers, for example. Alternatively, the composite wafer map may be created for a group of bins, or for certain test parameters, such as DC tests or certain functional tests. In the example of FIG. 5, two groups of dies, Group A and Group B, are analyzed. As can be seen, the probe site on the left is recording more defective dies in a lot of wafers than the probe site on the right in each group. That is, while there are no recorded defects on the right side, for each of the two groups of dies for the lot of wafers, three of the four dies on the left side for each of the groups have defective dies. Because the stepping function of the multi-site probe card is known, it is possible to determine whether a given probe site, shown in our example as a probe on the left or right, is defective by analyzing predetermined groups of dies. The composite wafer map is also divided into sectors, shown in the example of FIG. 5 as sectors 1-9. Because certain sectors of the dies may have different characteristics, the analysis of the data may vary depending upon the sector being analyzed. For example, Sector 5 may generally provide more reliable information because the dies of Sector 5 are not affected by problems that may be associated with dies which are positioned closer to the edge of the wafer. A defective probe may be determined for groups of dies of other sectors based upon different criteria, taking into account edge effects of the wafer or other factors, for example. Although an example of a composite wafer map based upon a probe card having two probe sites is shown, data may be analyzed related to probe cards having any number of probe sites.

Turning now to FIG. 6, a bin code table may be used to identify a defective probe site of a probe card according to an embodiment of the present invention. The bin code table of FIG. 6 shows an example of defective wafers associated with bin tests. The table of FIG. 6 comprises a column indicating the number of the soft bin code, and a column for each of the probe site number 0 and the probe site number 1 of a multi-site probe. The soft bin code indicates a test of a sequence of tests applied to the dies. While some dies will pass a given number of tests, the remaining dies will eventually fail a test as the tests continue. Accordingly, there will be some distribution of failed dies for the bin codes, where dies failing within a certain number of bin code tests will be marked as defective and discarded. As can be seen, the number of failures for a given soft bin code is generally equal or almost equal for the two sites. However, the rate of failure for a given soft bin code may be clearly disproportionate between the two probe sites of the probe card. For example, all of the failures for bin 63 are for probe site number 1. Therefore, site number 1 is determined to be a defective probe and should be replaced. Preferably, a minimum threshold is set to prevent a false positive. For example, as shown for soft bin codes 0 and 5, probe site number 0 shows defective dies, while probe site number 1 shows no defective dies. However, because the numbers of defective dies are so low, they would fall below the threshold and therefore not be considered to determine whether a probe site is defective. Accordingly, the determination of defective dies is based upon an empirical analysis of failures during bin coding, enabling the replacement of a damaged or defective probe site while the wafers are still in the sorting process.

Figure 7:
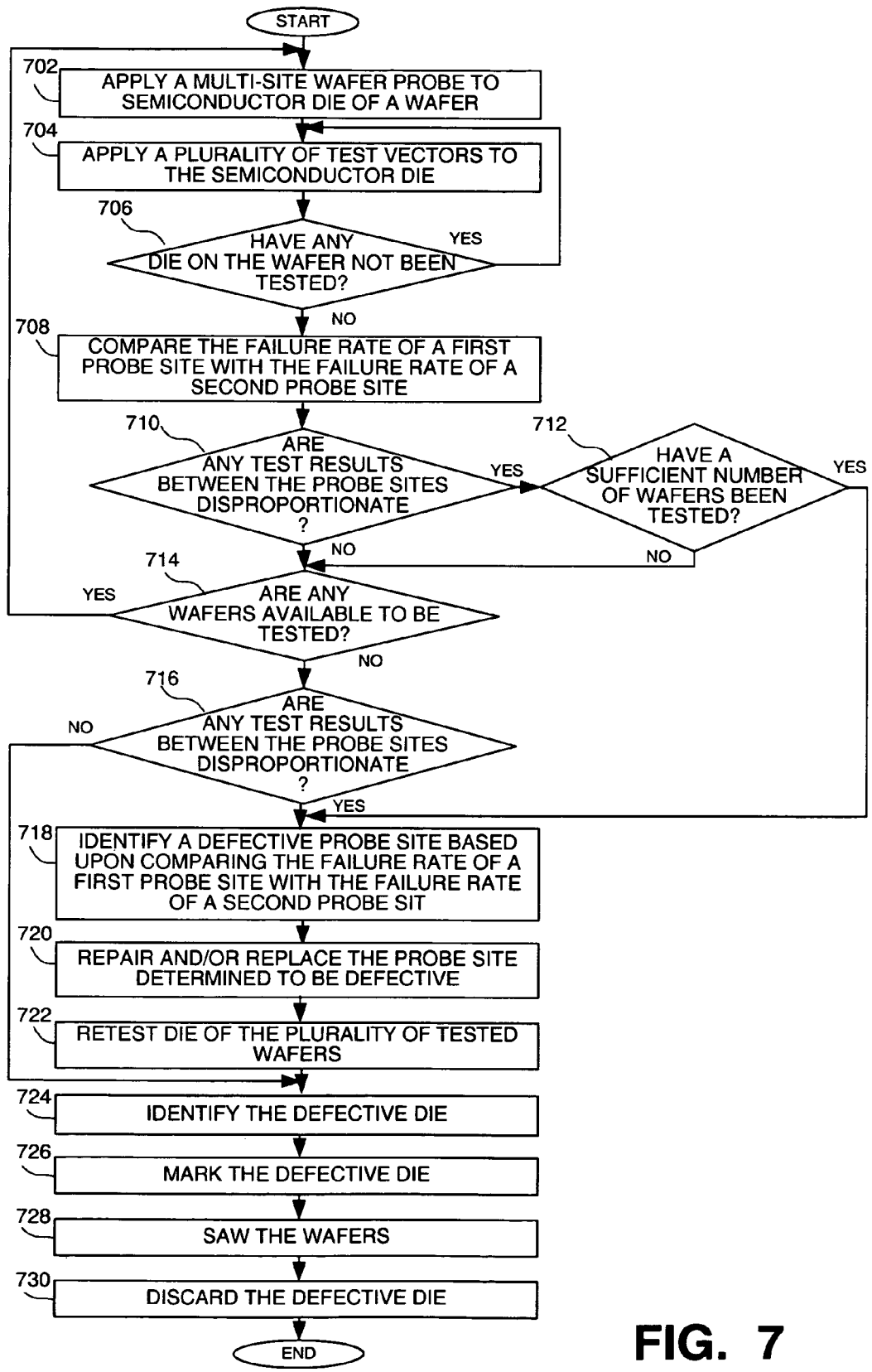
FIG. 7 is a flow chart showing a method of monitoring the functionality of a wafer probe site according to an embodiment the present invention.

Turning now to FIG. 7, a flow chart shows a method of monitoring the functionality of a wafer probe site according to an embodiment the present invention. In particular, a multi-site wafer probe is applied to a plurality of semiconductor dies of a wafer at a step 702. A plurality of test vectors is applied to the plurality of semiconductor dies at a step 704. It is then determined whether any die on the wafer have not been tested at a step 706. If some dies have not been tested, the dies will continue to be tested until all of the dies, or predetermined dies which are desired to be tested have been tested at the step 704. The failure rates of a first probe site of the multi-site probe are compared with the failure rate of a second probe site at a step 708. It is then determined whether any test results between the first probe site and the second probe site are disproportionate at a step 710. If so, it is then determined whether a sufficient number of wafers have been tested at a step 712. That is, in order to ensure that the data used to determine whether a probe site is defective, enough data must be collected to establish that a defect exists. However, if enough data has been taken and it is determined that a probe site is defective, it is not necessary to continue to test remaining wafers in a lot. While the method of FIG. 7, or the methods of FIGS. 8-9 which will be described in more detail below, may be implemented using data associated with dies of a single wafer or even a portion of a single wafer, the data may be compiled for a lot of wafers, or even multiple lots of wafers, to provide more accurate data. Accordingly, it is also determined whether any additional wafers are available to be tested at a step 714 if the test results between the probe sites are not disproportionate.

If there are no wafers left to be tested at step 714, it is again determined whether any test results between the first probe site and the second probe site are disproportionate at a step 716. If failure data associated with probe sites is determined to be disproportionate, it is then determined whether a probe site of the multi-site probe is defective based upon the comparison of the failure rate of a first probe site with the failure rate of a second probe site at a step 718. There can be many types of comparisons that can be made before flagging the operator. The comparisons may be based upon data of composite wafer map or a bin code table. Some other types of comparison are $I_{cc}$ average measurements and other comparisons not limited to bin information. The probe site that is determined to be defective is repaired and/or replaced at a step 720. If the failure rate is determined to be defective, the entire lot of wafers may be retested. Alternatively, dies which appear to be determined to be defective as a result of a defective probe site based upon the analysis of the data for the probe site may be retested. That is, because the lot of wafers is still in the wafer sorter or the wafer sort area during the wafer sorting process, any retesting of the wafers is easily performed after a complete lot of wafers has been tested. One or more of the dies of the plurality of tested wafers are retested at a step 722. The dies which are retested may vary depending upon the test results. For example, only dies of groups which show disproportionate defective dies between the probes are retested. Alternatively, all the dies of the wafers may be retested. The bad dies are then identified as a part of a supplemental output identifying defective dies at a step 724 and marked at a step 726. That is, the supplemental output will identify the dies which are believed to be truly defective, and not designated as defective because a probe site is defective. The wafers are then sawed at a step 728, where the dies which are determined to be defective are discarded at a step 730. Accordingly, the method of FIG. 7 performs calculations in real time to enable operator intervention in the event of mis-binning of dies during the wafer sort operation.

Figure 8:
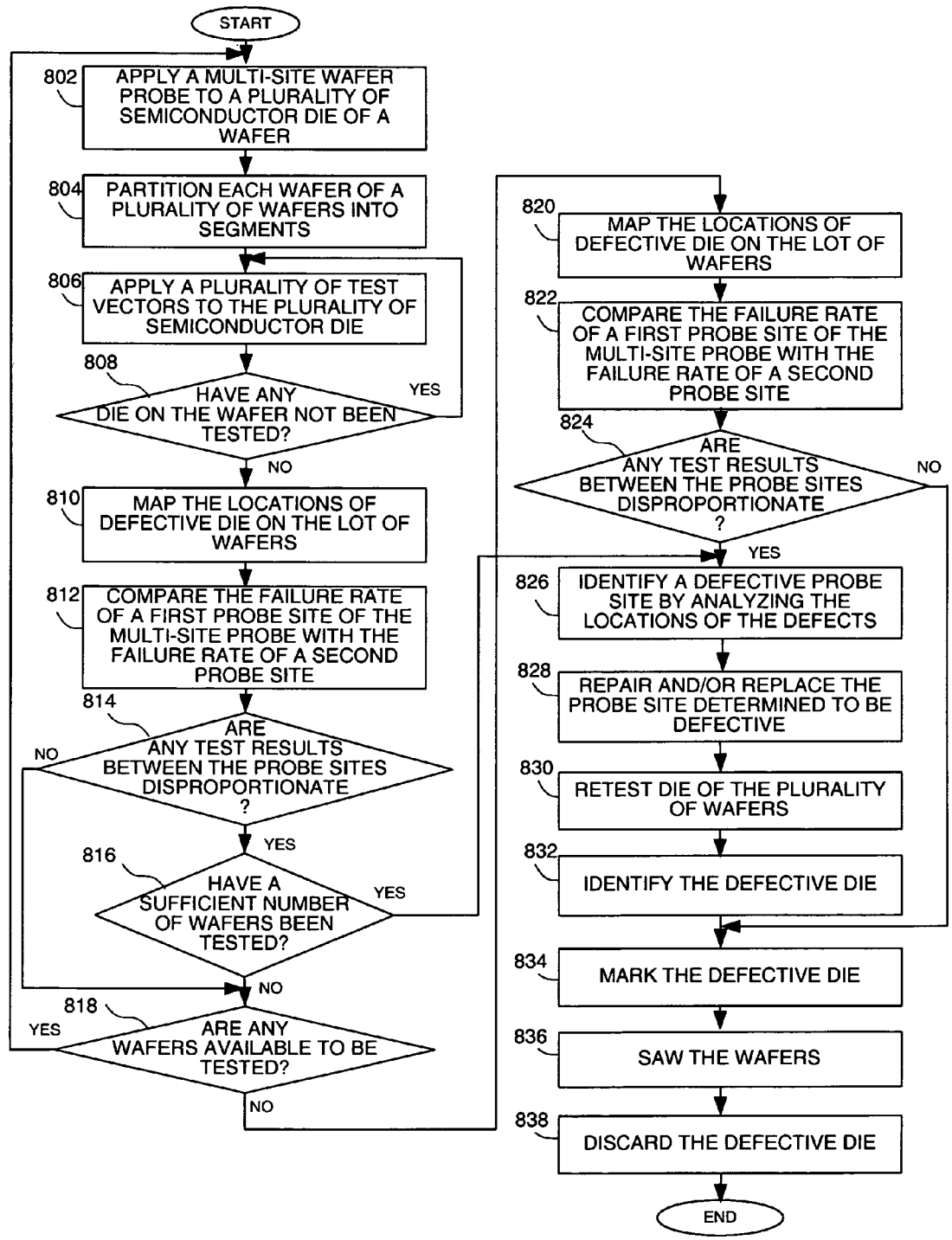
FIG. 8 is a flow chart showing a method of monitoring the functionality of a wafer probe site based upon a composite wafer die map according to an embodiment the present invention.

Turning now to FIG. 8, a flow chart shows a method of monitoring the functionality of a wafer probe based upon a composite wafer die map according to an embodiment the present invention. Mis-binning may also be identified by examining the composite wafer map as shown in FIG. 5, where a distinct pattern of odd/even columns shows either failing many sites or passing all sites. The method of FIG. 8 performs bin comparison by site in the wafer sort test program, and solves the problem of identifying mis-binning at wafer sort on multi-site probe cards. In particular, a multi-site wafer probe is applied to a plurality of semiconductor dies of a wafer at a step 802. Each wafer of the plurality of wafers is partitioned into sectors, as shown for example in FIG. 5, at a step 804. A plurality of test vectors is applied to the plurality of semiconductor dies at a step 806. It is then determined whether any dies on the wafer which should be tested have not been tested at a step 808. If not, the locations of defective dies on the lot of wafers are then mapped at a step 810. The failure rates of a first probe site of the multi-site probe are compared with the failure rate of a second probe site at a step 812. It is then determined whether any test results between the first probe site and the second probe site are disproportionate at a step 814. It is also determined whether a sufficient number of wafers have been tested at a step 816. If there are no test results which are disproportionate between probe sites or a sufficient number of wafers have not been tested, it is also determined whether any additional wafers are available to be tested at a step 818. If not, the locations of defective dies on the lot of wafers are then mapped at a step 820. The failure rates of a first probe site of the multi-site probe are compared with the failure rate of a second probe site at a step 822. It is then determined whether any test results between the first probe site and the second probe site are disproportionate at a step 824. If the test results between the probe sites are disproportionate after a sufficient number of wafers or all of the wafers, it is then determined whether a probe site of the multi-site probe is defective based upon comparing the failure rate of a first probe site with the failure rate of a second probe site at a step 826. The probe site that is determined to be defective is repaired and/or replaced at a step 828. One or more of the dies of the plurality of tested wafers are retested at a step 830. The defective dies are then identified at a step 832 and marked at a step 834. The wafers are then sawed at a step 836, where the dies determined to be defective are discarded at a step 838.

As set forth above in the description of FIG. 5, the failure rates may be based upon failed dies of given groups of dies, for example. The criteria for determining whether the test results between the probe sites are disproportionate may vary depending upon a number of factors, such as devices being tested, the equipment being used in testing, etc. While it is clear that when a significant number of defective dies are detected with one probe site and no defective dies are detected with another probe site would indicate a defective probe, the degree of variation between the probe sites may vary. That is, it is not necessary that there are no defects for the second probe site to determine that there is a defect.

Figure 9:
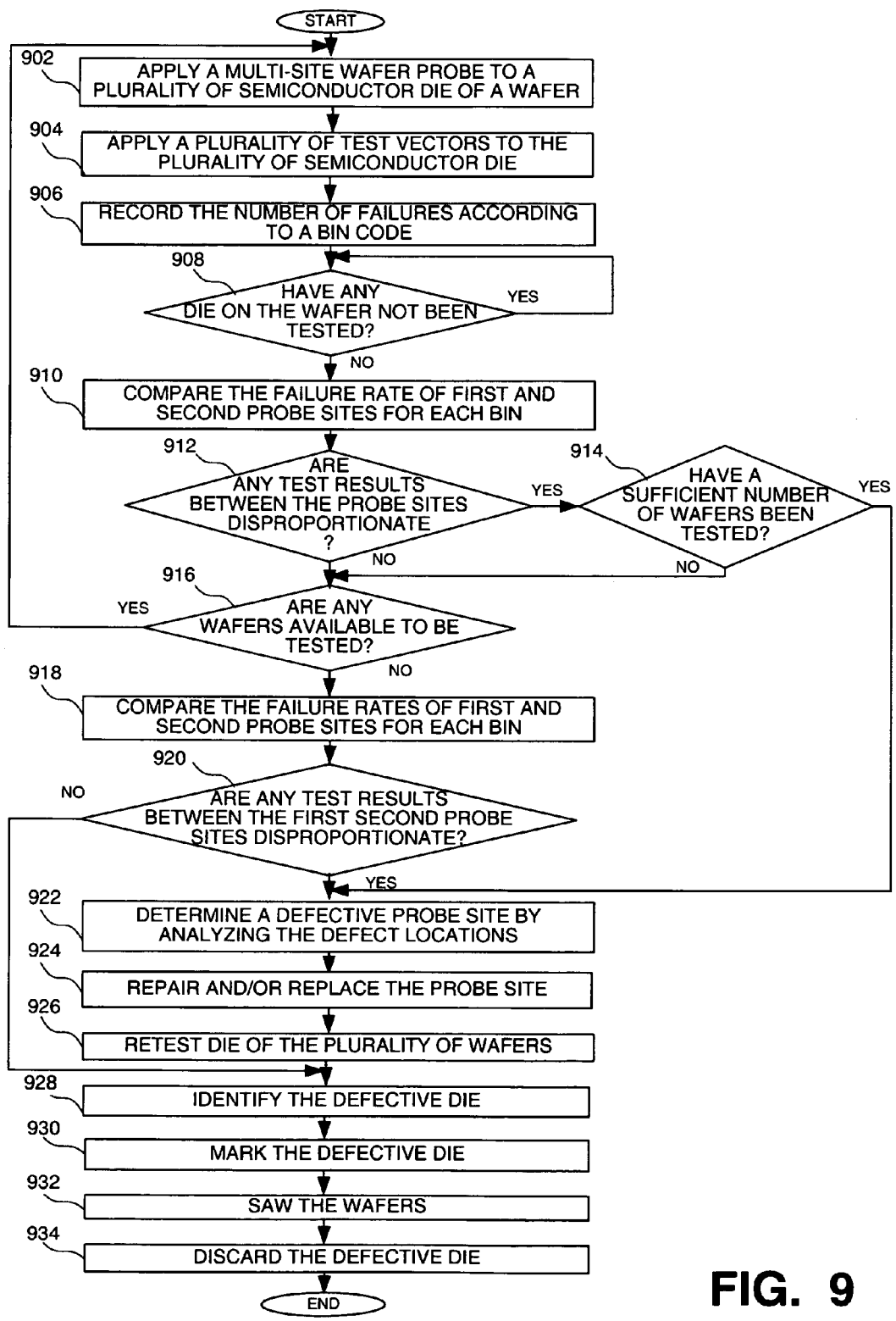
FIG. 9 is a flow chart showing a method of monitoring the functionality of a wafer probe site based upon a bin code table according to an embodiment the present invention.

Finally, turning to FIG. 9, a flow chart shows a method of monitoring the functionality of a wafer probe based upon a bin code table according to an embodiment the present invention. The bin comparisons will calculate bin percentages by probe site number and compare sites. If bin percentages show an obvious difference, such as the bin 63 in the table of FIG. 6 showing 100 percent difference with 61 defects on the site number 1 and no defects on the site number 2, then the wafer sort program will flag the operator of the discrepancy and require that the probe card be checked. In particular, a multi-site wafer probe is applied to a plurality of semiconductor dies of a wafer at a step 902. A plurality of test vectors is applied to the plurality of semiconductor dies at a step 904. The number of failures according to bin code is recorded at a step 906. It is then determined whether any dies on the wafer have not been tested at a step 908. The failure rates of a first probe site of the multi-site probe are compared with the failure rates of a second probe site at a step 910. It is then determined whether any test results between the first probe site and the second probe site are disproportionate at a step 912. If the comparison determines that there are a disproportionate number of defects between the probe sites, it is then determined at a step 914 whether a sufficient number of wafers have been tested. If the results are not disproportionate at the step 912 or a sufficient number of wafers have not been tested at the step 914, it is also determined whether any additional wafers of the lot need to be tested at a step 916. If no additional wafers are available to be tested, the failure rates of a first probe site of the multi-site probe are compared with the failure rates of a second probe site at a step 918. It is then determined whether any test results between the first probe site and the second probe site are disproportionate at a step 920. If there are disproportionate results between the wafers after all of the wafers or a sufficient number of wafers have been tested, it is then determined whether a probe site of the multi-site probe is defective based upon comparing the failure rate of a first probe site with the failure rate of a second probe site at a step 922. The probe site that is determined to be defective is repaired and/or replaced at a step 924. One or more of the dies of the plurality of tested wafers are retested at a step 926. The defective dies then identified at a step 928 and marked at a step 930. The wafers are then sawed at a step 932, where the defective dice are discarded at a step 934. The methods of FIGS. 7-9 may be implemented using the systems described in FIGS. 1-6 as described above, or other suitable systems. In particular, the methods of FIGS. 7-9 for analyzing the probe cards may be implemented on test computer 202 implementing a computer-readable storage medium comprising computer-executable code for monitoring the functionality of a multi-site probe card.

It can therefore be appreciated that the new and novel method of and system for monitoring the functionality of a wafer probe has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A method of monitoring the functionality of a wafer probe site, the method comprising:
   partitioning a wafer into a plurality of sectors comprising predetermined semiconductor dies, wherein semiconductor dies from different sectors comprise different performance characteristics based upon the location of the sectors on the wafer;
   applying a multi-site probe of a wafer sorter to a plurality of semiconductor dies in a least one sector of the plurality of sectors;
   comparing a first failure rate of a first probe site of the multi-site probe with a second failure rate of a second probe site of the multi-site probe for a test of the plurality of semiconductor dies in the at least one sector during a wafer sorting process; and
   determining that a probe site of the multi-site probe is defective based upon comparing the first failure rate of the first probe site of the multi-site probe with the second failure rate of the second probe site of the multi-site probe and the location of the at least one sector during the wafer sorting process.

2. The method of claim 1 wherein comparing the first failure rate of a first probe site of the multi-site probe with the second failure rate of a second probe site of the multi-site probe comprises comparing failure rates of a plurality of test vectors applied to the first probe site and the second probe site.

3. The method of claim 2 wherein determining that a probe site of the multi-site probe is defective comprises comparing the first failure rate of the first probe site of the multi-site probe with the second failure rate of the second probe site of the multi-site probe for each test vector of the plurality of test vectors.

4. The method of claim 1 wherein determining that a probe site of the multi-site probe is defective comprises determining that a probe site of the first probe site and the second probe site have a disproportionate number of errors.

5. The method of claim 1 wherein applying a multi-site probe to a plurality of semiconductor dies comprises applying a multi-site probe to a plurality of semiconductor wafers.

6. The method of claim 5 wherein determining that a probe site of the multi-site probe is defective comprises comparing the first failure rate of the first probe site of the multi-site probe with the second failure rate of the second probe site of the multi-site probe for each test vector of a plurality of test vectors for the plurality of semiconductor wafers.

7. The method of claim 1 further comprising retesting semiconductor dies of the plurality of semiconductor dies if a probe site is determined to be defective.

8. A method of monitoring the functionality of a wafer probe site, the method comprising:
partitioning a wafer into a plurality of sectors comprising predetermined semiconductor dies, wherein semiconductor dies from different sectors comprise different performance characteristics based upon the location of the sectors on the wafer;
applying a multi-site probe of a wafer sorter to a plurality of semiconductor wafers comprising semiconductor dies in a least one sector of the plurality of sectors;
comparing a first failure rate of a first probe site of the multi-site probe with a second failure rate of a second probe site of the multi-site probe for a plurality of semiconductor dies of the plurality of wafers in the at least one sector during a wafer sorting process;
determining that a probe site of the multi-site probe is defective based upon comparing the first failure rate of the first probe site of the multi-site probe with the second failure rate of the second probe site of the multi-site probe and the location of the at least one sector during the wafer sorting process; and
retesting semiconductor dies of the plurality of semiconductor wafers.

9. The method of claim 8 wherein comparing the first failure rate of a first probe site of the multi-site probe with the second failure rate of a second probe site of the multi-site probe comprises comparing failure rates for a plurality of test vectors applied to the first probe site and the second probe site.

10. The method of claim 9 wherein determining that a probe site of the multi-site probe is defective comprises comparing the first failure rate of the first probe site of the multi-site probe with the second failure rate of the second probe site of the multi-site probe for each test vector of the plurality of test vectors.

11. The method of claim 8 wherein retesting semiconductor dies of the plurality of semiconductor wafers comprises retesting selected semiconductor dies of a wafer with a different multi-site probe.

12. The method of claim 8 wherein retesting semiconductor dies of the plurality of semiconductor wafers comprises retesting an entire wafer with a different multi-site probe.

13. The method of claim 8 further comprising a step of identifying defective semiconductor dies of the plurality of semiconductor dies after retesting semiconductor dies.

14. The method of claim 8 further comprising establishing a minimum threshold of tested semiconductor dies for determining that a probe site is defective.

15. A system for monitoring the functionality of a wafer probe site, the system comprising:
a multi-site probe having a plurality of probe sites;
a wafer sorter coupling a wafer to the multi-site probe, the wafer being partitioned into a plurality of different sectors comprising predetermined semiconductor dies, wherein semiconductor dies from the different sectors comprise different performance characteristics based upon the location of the sectors on the wafer;
a test computer coupled to apply test vectors to the multi-site probe and receive output signals from the multi-site probe; and
an output of the test computer comprising a comparison of a first failure rate of a first probe site of the multi-site probe with a second failure rate of a second probe site of the multi-site probe for a test of a plurality of semiconductor dies in at least one sector of the plurality of sectors, wherein the output comprises a determination of a defective probe site of the multi-site probe based upon the comparison of the first failure rate and the second failure rate and the location of the at least one sector on the wafer.

16. The system of claim 15 wherein the output comprises a comparison of the first failure rate of the first probe site of the multi-site probe with the second failure rate of the second probe site of the multi-site probe for each test of a plurality of tests of the plurality of semiconductor dies.

17. The system of claim 15 wherein the output comprises a comparison of the first failure rate of the first probe site of the multi-site probe with the second failure rate of the second probe site of the multi-site probe for each test of a plurality of tests for a plurality of wafers having semiconductor dies.

18. The system of claim 15 further comprising a supplemental output after retesting semiconductor dies.

19. The system of claim 18 wherein the supplemental output comprises a determination of defective semiconductor dies.

20. The system of claim 19 further comprising a saw for sawing the dies and enabling discarding the defective semiconductor dies.

* * * * *